(12) United States Patent
Rober

(10) Patent No.: US 7,432,721 B2
(45) Date of Patent: Oct. 7, 2008

(54) SOLENOID ACTUATOR MOTION DETECTION

(75) Inventor: Stephen Rober, Arlington Heights, IL (US)

(73) Assignee: Temic Automotive of North America, Inc., Deer Park, IL (US)

( * ) Notice: Subject to any disclaimer, the term of this patent is extended or adjusted under 35 U.S.C. 154(b) by 0 days.

(21) Appl. No.: 11/612,269

(22) Filed: Dec. 18, 2006

(65) Prior Publication Data

US 2008/0143346 A1 Jun. 19, 2008

(51) Int. Cl.
*G01B 31/08* (2006.01)

(52) U.S. Cl. .................. 324/522; 324/207.16; 324/418; 340/635; 137/1

(58) Field of Classification Search .................. 324/522
See application file for complete search history.

(56) References Cited

U.S. PATENT DOCUMENTS

| | | | | |
|---|---|---|---|---|
| 2,886,243 | A * | 5/1959 | Sprague et al. | ................. 708/9 |
| 4,321,945 | A | 3/1982 | Chabat-Courrede | |
| 4,481,473 | A | 11/1984 | Compton | |
| 4,814,937 | A | 3/1989 | Uota | |
| 4,823,825 | A * | 4/1989 | Buchl | ............................ 137/1 |
| 4,953,056 | A | 8/1990 | Yakuawa et al. | |
| 4,970,622 | A | 11/1990 | Buchl | |
| 5,053,911 | A | 10/1991 | Kopec et al. | |
| 5,241,218 | A | 8/1993 | Page | |
| 5,442,671 | A | 8/1995 | Wollschlage et al. | |
| 5,548,210 | A | 8/1996 | Dittrich | |
| 5,784,245 | A | 7/1998 | Moraghan et al. | |
| 5,808,471 | A | 9/1998 | Rooke et al. | |
| 6,211,665 | B1 * | 4/2001 | Ahrendt et al. | ......... 324/207.16 |
| 6,233,132 | B1 | 5/2001 | Jenski | |
| 6,326,898 | B1 * | 12/2001 | O'Leyar et al. | ............. 340/635 |
| 6,903,554 | B2 * | 6/2005 | Wilson et al. | ................ 324/418 |
| 6,917,203 | B1 * | 7/2005 | Perotti et al. | ................ 324/418 |
| 6,934,140 | B1 | 8/2005 | Rober et al. | |
| 2006/0036402 | A1 * | 2/2006 | Deller et al. | ................ 702/183 |

OTHER PUBLICATIONS

Position Estimation in Solenoid Actuators, Rahman, M. F., Cheung, N. C., Lim, K. W., IEEE Transactions on Industry Applications, vol. 32, No. 3, May/Jun. 1996.*

* cited by examiner

*Primary Examiner*—Vincent Q. Nguyen
*Assistant Examiner*—Benjamin M Baldridge

(57) ABSTRACT

A method of determining change in actuator position includes determining a slope of the inductor current with time and determining whether the slope exceeds a first predetermined slope for a first predetermined time, determining whether the slope is less than a second predetermined slope for a second predetermined time when the slope exceeds the first predetermined slope for the first predetermined time, and determining whether the slope exceeds a third predetermined slope for a third predetermined time when the slope is less than the second predetermined slope for the second predetermined time. The method further includes determining the change in actuator position when the slope exceeds the third predetermined slope for the third predetermined time.

20 Claims, 7 Drawing Sheets

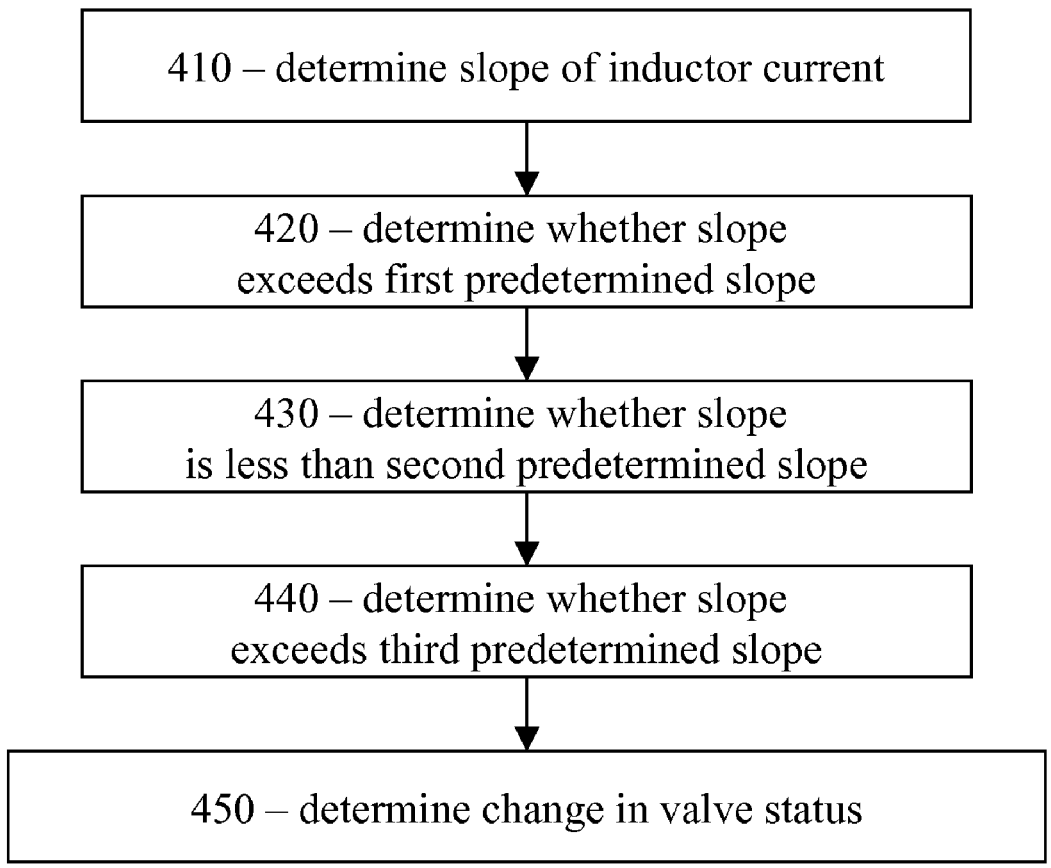

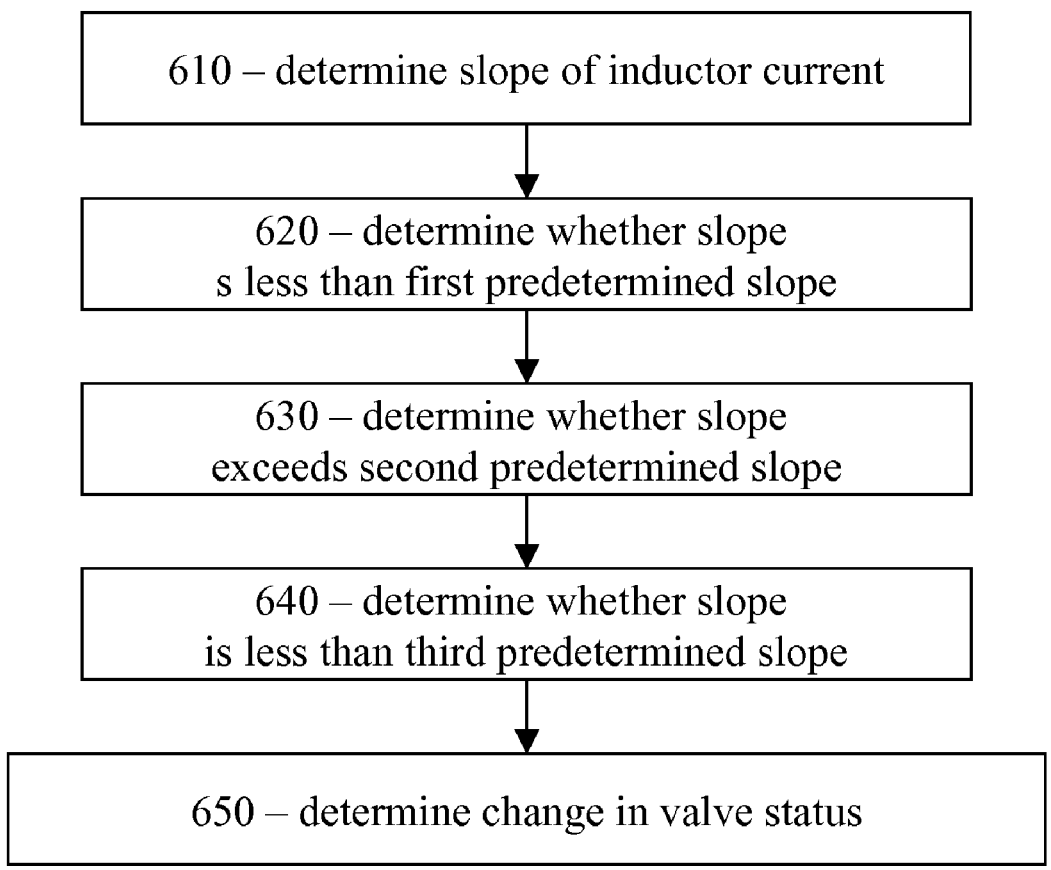
FIG. 6    600

SOLENOID ACTUATOR MOTION DETECTION

TECHNICAL FIELD OF THE INVENTION

The present invention relates generally to actuator instrumentation and more particularly to solenoid actuator motion detection instrumentation.

BACKGROUND OF THE INVENTION

Solenoid actuators, such as solenoid valves, are common in many applications. These applications include automobiles, including but not limited to, the power train. In use, it is often advantageous to know whether the actuator is open or closed, or more precisely whether the actuator position (i.e. open or closed) has changed. Knowledge of the actuator position allows for an error check to make sure that an actuator that is supposed to open is actually open and a actuator that is supposed to be closed is actually closed.

A solenoid actuator includes a solenoid wrapped around a solenoid core, which is attached to a valve, gear, or other device to be moved. When a current is applied to the solenoid, the magnetic field from the solenoid produces a force on the solenoid core, moving the actuator open or closed. When the ferrous core (typically iron or steel) begins to move, the inductive properties of the coil change, affecting the back EMF and the resultant current through the inductor. By monitoring the change in inductance of the solenoid, the mechanical motion can be detected for diagnostic purposes. Typically the current is monitored for this change in inductance, however, other methods have also been employed. One method of measuring the current is to measured the voltage differential across a sense resistor connected in series with the solenoid.

The current through the solenoid changes as the solenoid is energized and the core moves. As the current is applied to the solenoid, the current profile changes based on the inductive properties of the solenoid coil, and proceeds through three zones—a base state, a changing state, and a changed state. The position of the actuator can be determined in response to the slope of the current profile, as illustrated in FIGS. 1A and 1B. When the slope of the current profile changes from a positive slope (i.e., the first zone or base state) to a negative slope (i.e. in the second zone or the changing zone), the actuator is changing its position, and when the current profile resumes a positive slope in the third zone, the actuator has completed a change.

Present systems for detecting solenoid actuator motion rely on a local maximum and local minimum found in the measured current profile for a solenoid actuator. As seen in the plot of measured current with time 110 in FIG. 1A, the measured current increases in Zone 120 when the power to the solenoid is switched ON and reaches a local maximum. The measured current peaks and declines to a local minimum in Zone 130 as the core begins to move. The measured current increases from the local minimum in Zone 140 and asymptotically approaches a steady state value as the valve is moving. The plot of measured current with time 110 in FIG. 1B shows the case in which the core fails to move when the power to the solenoid is switched ON. The inductance of the core stays constant and the measured current increases smoothly, without a maximum or minimum. One example of verifying solenoid operation is U.S. Pat. No. 5,808,471 to Rooke. Rooke relies on the local maximum, the local minimum and the increase after the minimum to detect that the core is moving.

Unfortunately, not all solenoid valves exhibit the current profile of FIG. 1A. Only solenoid valves with relatively high inductance exhibit the local maximum and minimum. High inductance solenoid valves are not desirable in all applications, so the present systems for detecting solenoid actuator motion cannot be used for all applications. In contrast to the current profile exhibited in high inductance actuators, the current profile exhibited in lower inductance actuators is more similar to that illustrated in FIG. 2.

Another problem for the present systems is solenoid valves controlled by Pulse Width Modulation (PWM) circuitry. PWM controlled valves cycle on and off too quickly to accurately measure a local maximum and minimum. Peaks are not caused by inductance but by the cycling current inherent in PWM circuits. present systems perform best with smooth waveforms, but PWM controlled valves include high frequency components as shown in FIG. 1C and in a more detailed view in FIG. 1D.

Therefore, it would be desirable to provide a method for determining changes in actuator position that would overcome the aforementioned and other disadvantages.

SUMMARY OF THE INVENTION

One aspect of the invention provides a method of determining change in actuator position that includes determining a slope of the inductor current with time and determining whether the slope exceeds a first predetermined slope for a first predetermined time, determining whether the slope is less than a second predetermined slope for a second predetermined time when the slope exceeds the first predetermined slope for the first predetermined time, and determining whether the slope exceeds a third predetermined slope for a third predetermined time when the slope is less than the second predetermined slope for the second predetermined time. The method further includes determining the change in actuator position when the slope exceeds the third predetermined slope for the third predetermined time.

Another aspect of the invention provides a computer readable medium including computer readable code for determining a change in actuator position that includes computer readable code for determining a slope of the inductor current with time and computer readable code for determining whether the slope exceeds a first predetermined slope for a first predetermined time, computer readable code for determining whether the slope is less than a second predetermined slope for a second predetermined time when the slope exceeds the first predetermined slope for the first predetermined time, and computer readable code for determining whether the slope exceeds a third predetermined slope for a third predetermined time when the slope is less than the second predetermined slope for the second predetermined time. The medium further includes computer readable code for determining the change in actuator position when the slope exceeds the third predetermined slope for the third predetermined time.

Another aspect of the invention provides a method for determining an initial actuator position, the actuator position being open or closed. The method includes determining a actuator model associated with a solenoid valve, determining at least one characteristic of the solenoid valve based on the actuator model and determining a slope of the inductor current with time. Additionally, the method includes determining whether the slope exceeds a first predetermined slope for a first predetermined time, determining whether the slope is less than a second predetermined slope for a second predetermined time when the slope exceeds the first predetermined slope for the first predetermined time, and determining whether the slope exceeds a third predetermined slope for a third predetermined time when the slope exceeds the second predetermined slope for the second predetermined time. The method further includes determining the change in actuator position when the slope exceeds the third predetermined slope for the third predetermined time, and determining a new actuator position based on the determined actuator position change.

Another aspect of the invention provides a method of determining change in actuator position from inductor current. The method includes determining a slope of the inductor current with time, determining whether the slope is less than a first predetermined slope for a first predetermined time, determining whether the slope exceeds a second predetermined slope for a second predetermined time when the slope is less than the first predetermined slope for the first predetermined time, and determining whether the slope is less than a third predetermined slope for a third predetermined time when the slope exceeds the second predetermined slope for the second predetermined time. The method further includes determining the change in actuator position when the slope exceeds the third predetermined slope for the third predetermined time.

The foregoing and other features and advantages of the invention will become further apparent from the following detailed description of the presently preferred embodiments, read in conjunction with the accompanying drawings. The detailed description and drawings are merely illustrative of the invention, rather than limiting the scope of the invention being defined by the appended claims and equivalents thereof.

BRIEF DESCRIPTION OF THE DRAWINGS

FIG. 4 illustrates a flowchart outlining steps in a method for determining actuator position, in accordance with an aspect of the invention;

FIG. 6 illustrates a flowchart outlining steps in a method for determining actuator position, in accordance with an aspect of the invention.

DETAILED DESCRIPTION

Use of the disclosures herein allows determination of actuator position changes for low impedance solenoid valves by determining changes in current slope instead of negative current slopes.

Figure 1A:
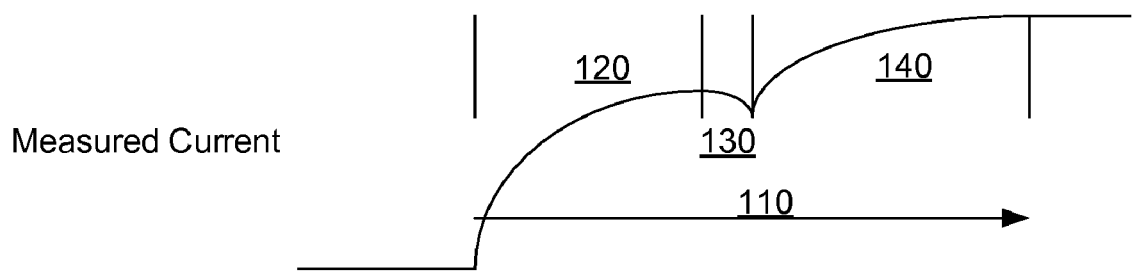
FIG. 1A illustrates an exemplary current profile for a large inductance solenoid valve in accordance with the prior art.
Figure 1B:
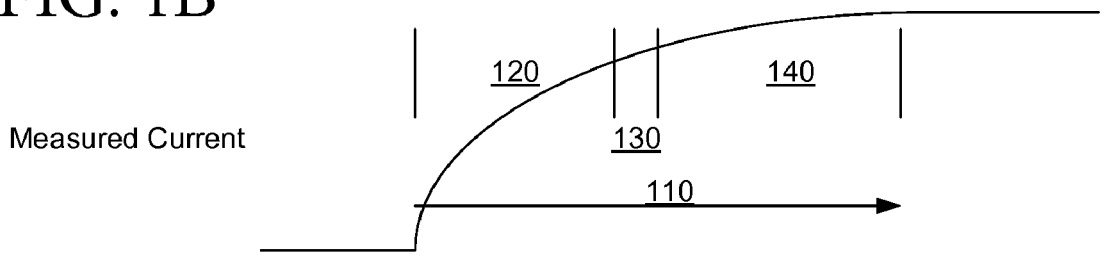
FIG. 1B illustrates an exemplary current profile for a large inductance solenoid valve in accordance with the prior art.
Figure 1C:
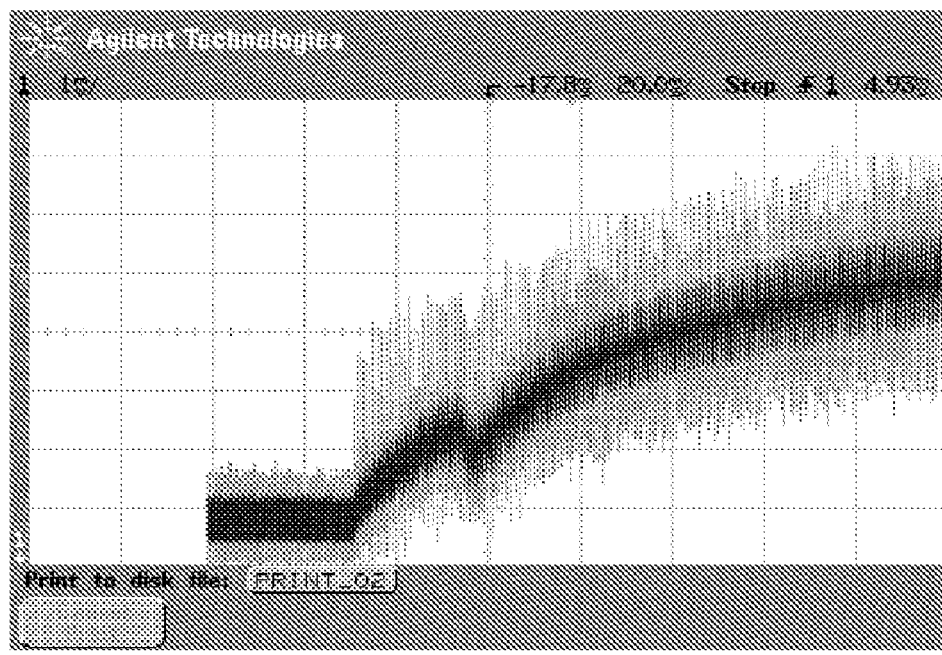
FIG. 1C illustrates an exemplary current profile for a PWM controlled solenoid valve.
Figure 1D:
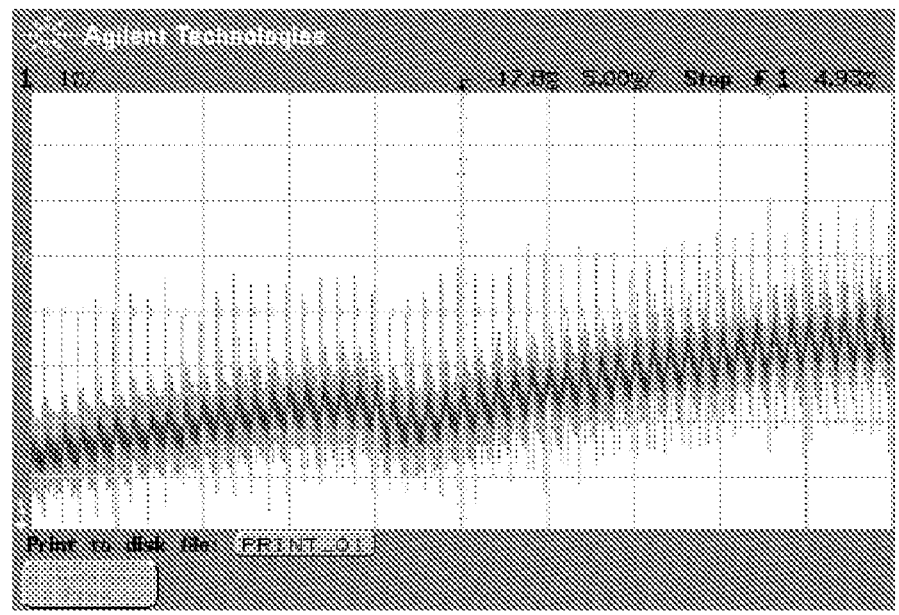
FIG. 1D illustrates a detailed view of the profile illustrated in FIG. 1C.
Figure 2:
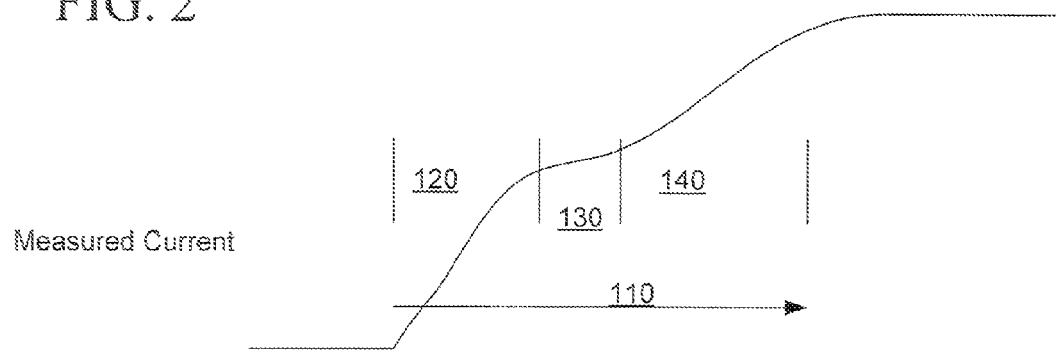
FIG. 2 illustrates a chart illustrating inductance current changes, in accordance with an aspect of the invention.
Figure 3:
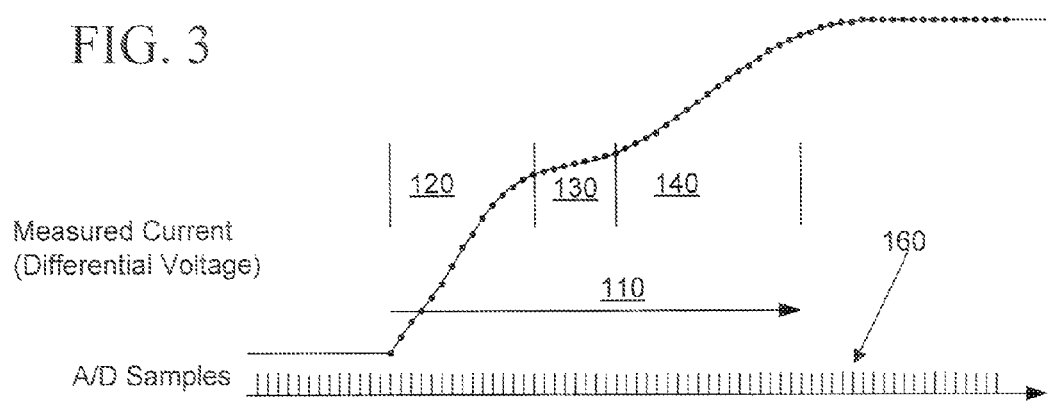
FIG. 3 illustrates a chart illustrating changes in inductance current, in accordance with an aspect of the invention.

FIG. 3 illustrates the current flow through a sense resistor in communication with a low inductance solenoid valve in accordance with one aspect of the invention. Current applied to a ferrous core of a solenoid valve increases during a first portion 120 of the curve, increases at a lower, non-zero, positive rate during a second portion 130 of the curve, and a third rate during a third portion 140 of the curve with respect to time 110. Each current sample is identified as sample 160.

FIG. 4 illustrates one embodiment of a method 400 for determining change in actuator states in accordance with one aspect of the invention.

Method 400 begins by determining a slope of the inductor current with time at block 410. The slope is determined by the difference between sequential samples of voltage differential across a sense resistor, in one embodiment. In another example, the slope of the inductor current is determined based on receiving a plurality of current inputs and determining a difference between two of the received current inputs. Alternatively, the current inputs can be received as voltage differentials. In another embodiment, the slope of the inductor current is determined based on receiving a plurality of current inputs (or voltage differentials) over a predetermined period of time, determining an average of the current inputs over the predetermined period of time, and determining the slope based on the determined average of the current inputs (or voltage differentials). Techniques for determining the average are discussed in greater detail below, with reference to FIG. 5. In one embodiment, the predetermined period of time is measured with counts of discrete time spans. These time spans can be clock counts, cycles, or other discrete increments. In various embodiments, the predetermined time can be measured in analog or in digital. Alternatively, the predetermined time can be measured based on a number of samples.

The sampling technique can vary depending on implementation, and can be synchronized to a clock, to a cycle, or a series of cycles, for example. In another embodiment, the sampling is synchronized to a PWM period. In another embodiment, the sampling is synchronized to a synchronized point within non-sequential PWM periods.

Method 400 then determines whether the slope exceeds a first predetermined slope for a first predetermined time at block 420. In the event that the slope does exceed the first predetermined slope for a first predetermined time, method 400 proceeds to determine if the slope is less than a second predetermined slope for a second predetermined time at block 430.

Based on the outcome of block 430, method 400 determines whether then slope exceeds a third predetermined slope for a third predetermined period of time at block 440. Method 400 then, at block 450, determines a change in actuator position when the slope exceeds the third predetermined slope for the third predetermined period. Thus, method 400 determines a change in actuator position without the inductance slope becoming negative—the method determines changes in actuator position based on a change in the inductance slope rather than the slope becoming negative.

Figure 5A:
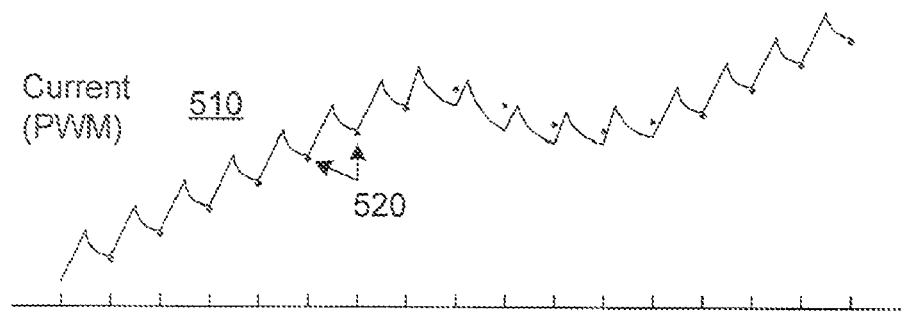
FIGS. 5A, 5B, and 5C illustrate a chart illustrating changes in inductance current in a PWM controlled circuit, in accordance with an aspect of the invention.
Figure 5B:
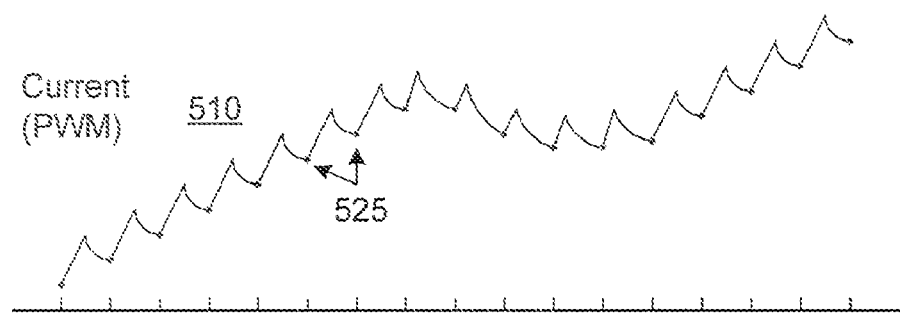
Figure 5C:
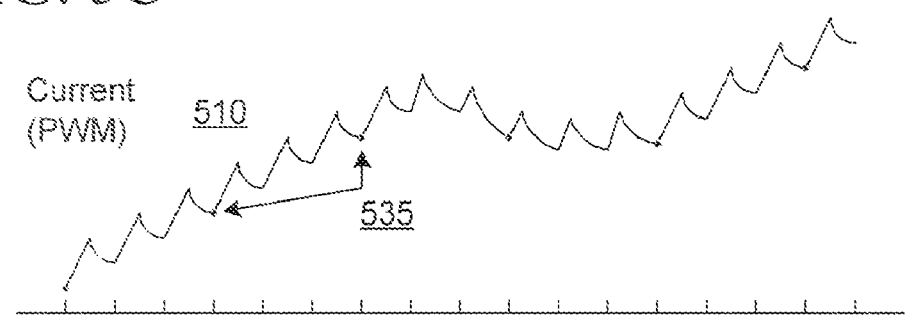

FIGS. 5A, 5B, and 5C illustrate PWM waveforms for determining an average current for determining the slope of the inductor current. As used herein, the term "average" is defined as including any appropriate technique for averaging, including but not limited to, arithmetic averaging, geometric averaging, means, medians, modes, and the like.

As shown in FIG. 5A, the inductor current 510 is sampled 520 based on a consistent and external basis, such as a clock. In FIG. 5A, the inductor current is sampled without consideration of the PWM cycle. In contrast, in FIG. 5B, the inductor current is sampled at a consistent point within the PWM cycle. As shown in FIG. 5B, the consistent point 525 within the PWM cycle is the cycle low point. Any particular point between the cycle high point and cycle low point, inclusive, could be selected for the sample, so long as the sampling is substantially consistent across PWM cycles. In yet another example, illustrated in FIG. 5C, the sampling 535 can extend across non-sequential PWM cycles. In such non-sequential sampling, the sampling is synchronized to occur every n cycles, such as n=3. Any number of intermediate PWM cycles can be sampled. In one embodiment, the sampling rate is determined based on physical limitations on the speed of sampling.

In one embodiment, the first predetermined slope, first predetermined time, second predetermined slope, second predetermined time, third predetermined slope and third predetermined time are variables stored in volatile or nonvolatile memory. Each of these values are characteristics of the performance of particular solenoid valves such that if the particular solenoid valve is known, the characteristics of the solenoid valve can be determined by accessing the stored values.

In one embodiment, the methods disclosed herein further include determining a actuator model associated with the solenoid valve, and accessing a chip storing the first predetermined slope, first predetermined time, second predetermined slope, second predetermined time, third predetermined slope and third predetermined time associated with the actuator model. The actuator model can be determined based on data stored in volatile or nonvolatile memory. In one embodiment, at least one of the first predetermined slope, first predetermined time, second predetermined slope, second predetermined time, third predetermined slope, and third predetermined time is determined based on characteristics of the actuator. These characteristics are determined in advance of device operation, and hard coded into a chip in communication with the controller controlling actuator operation, in one embodiment.

Additionally, in one embodiment, the methods further include determining an initial actuator position (such as open or closed). Given an initial position of the actuator, a new actuator position is determined based on the determined actuator position change. For example, if the actuator is initially in an open state, and the methods disclosed herein determine a change in actuator state, the methods determine that the new actuator position is closed. Conversely, if the actuator is initially in a closed state, and the methods disclosed herein determine a change in actuator state, the methods determine that the new actuator position is open.

In another embodiment, if the slope exceeds a first predetermined slope for a first predetermined period of time without the slope then being less than the second predetermined slope for the second predetermined period of time, the method detects that the actuator is not behaving as expected. Such a situation can exist based on a physical block of the actuator, including undesired build up on the actuator that prevents a full open or full close of the actuator. In another embodiment, the method determines a failure in the event that the slope remains at the first predetermined slope for a time period that exceeds the first predetermined period of time by a predetermined factor.

Figure 7:
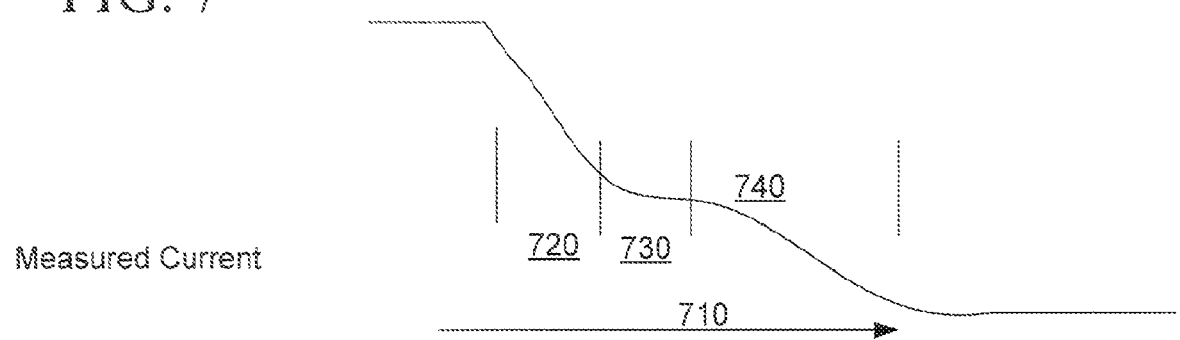
FIG. 7 illustrates a chart illustrating changes in inductance current, in accordance with in accordance with an aspect of the invention.

In yet another embodiment of the invention, the methods monitor for inverse relationships. In such embodiments, the methods determine whether high level currents (differential voltages) transition to lower level currents as illustrated in FIG. 7, with first zone 720, second zone 730, and third zone 740 illustrating the measured current decline with time 710. This embodiment is illustrated in FIG. 6 as method 600. Method 600 is implemented in a similar fashion as method 400, but with inverse determinations.

FIG. 6 illustrates another embodiment of a method 600 for determining change in actuator states in accordance with one aspect of the invention.

Method 600 begins by determining a slope of the inductor current with time at block 610. The slope is determined by the difference between sequential samples of voltage differential across a sense resistor, in one embodiment. In another example, the slope of the inductor current is determined based on receiving a plurality of current inputs and determining a difference between two of the received current inputs. Alternatively, the current inputs can be received as voltage differentials. In another embodiment, the slope of the inductor current is determined based on receiving a plurality of current inputs (or voltage differentials) over a predetermined period of time, determining an average of the current inputs over the predetermined period of time, and determining the slope based on the determined average of the current inputs (or voltage differentials).

Method 600 then determines whether the slope is less than a first predetermined slope for a first predetermined time at block 620. In the event that the slope is less than the first predetermined slope for a first predetermined time, method 600 proceeds to determine if the slope exceeds a second predetermined slope for a second predetermined time at block 630.

Based on the outcome of block 630, method 600 determines whether the slope is less than a third predetermined slope for a third predetermined period of time at block 640. Method 600 then, at block 650, determines a change in actuator position when the slope is less than the third predetermined slope for the third predetermined period. Thus, method 600 determines a change in actuator position without the inductance slope becoming positive—the method determines changes in actuator position based on a change in the inductance slope rather than the slope becoming negative.

If the methods fail, the methods determine that the actuator position has not changed from the initial actuator position such that the actuator remains in the initial state.

As used herein, the term "computer" is defined as any device configured to sequentially execute a series of instructions. Thus, the term computer includes, without limitation, computers, laptops, ASICs, microprocessors, state machines, custom logic devices. The instructions are computer readable code, and can be written in any appropriate language, such as C, Java, or the like. In addition, the computer readable code can be readable and writable and can be calibrated for multiple loads. In one embodiment, the computer readable code includes a database including entries for a plurality of commercially available solenoid actuators and/or solenoid valves and the physical characteristics of each of the actuators/valves.

It is important to note that the figures and description illustrate specific applications and embodiments of the present invention, and is not intended to limit the scope of the present disclosure or claims to that which is presented therein. Upon reading the specification and reviewing the drawings hereof, it will become immediately obvious to those skilled in the art that myriad other embodiments of the present invention are possible, and that such embodiments are contemplated and fall within the scope of the presently claimed invention.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

I claim:

1. A method of determining change in actuator position from inductor current for a solenoid valve, the method comprising:
   determining a slope of the inductor current with time;
   determining whether the slope is greater than a first predetermined slope for a first predetermined time;
   determining whether the slope is less than a second predetermined slope for a second predetermined time when the slope exceeds the first predetermined slope for the first predetermined time;
   determining whether the slope is greater than a third predetermined slope for a third predetermined time when the slope is less than the second predetermined slope for the second predetermined time; and
   detecting the change in actuator position when the slope exceeds the third predetermined slope for the third predetermined time.

2. The method of claim 1 wherein the determining a slope of the inductor current comprises receiving current inputs over time and determining a difference between successive current inputs.

3. The method of claim 1 wherein the determining a slope of the inductor current comprises receiving current inputs over a first predetermined time; averaging of the current inputs over the first predetermined time, receiving current inputs over a second predetermined time; averaging of the current inputs over the second predetermined time, and determining the slope of the inductor current based on the averaged current inputs in the first predetermined time and the second predetermined time.

4. The method of claim 1 wherein the determining a slope of the inductor current comprises receiving a current inputs over a predetermined time, the current inputs being synchronized to a PWM period.

5. The method of claim 1 wherein the determining a slope of the inductor current comprises receiving current inputs over a predetermined time, and sampling the current inputs at a synchronized point within non-sequential PWM periods.

6. The method of claim 1 wherein:
   the determining whether the slope exceeds a first predetermined slope comprises determining a first threshold and a first count,
   the determining whether the slope is less than a second predetermined slope comprises determining a second threshold and a second count; and
   the determining whether the slope exceeds a third predetermined slope comprises determining a third threshold and a third count.

7. The method of claim 1 further comprising:
   determining an actuator model associated with the solenoid valve; and
   accessing a chip storing at least one of a first threshold, first count, second threshold, second count, third threshold, and third count associated with the actuator model.

8. A computer readable medium including computer readable code for determining change in actuator position from inductor current, the medium comprising:
   computer readable code for determining a slope of the inductor current with time;
   computer readable code for determining whether the slope exceeds a first predetermined slope for a first predetermined time;
   computer readable code for determining whether the slope is less than a second predetermined slope for a second predetermined time when the slope exceeds the first predetermined slope for the first predetermined time;
   computer readable code for determining whether the slope exceeds a third predetermined slope for a third predetermined time when the slope is less than the second predetermined slope for the second predetermined time; and
   computer readable code for determining the change in actuator position when the slope exceeds the third predetermined slope for the third predetermined time.

9. The medium of claim 8 wherein computer readable code for determining a slope of the inductor current comprises computer readable code for receiving a plurality of current inputs and computer readable code for determining a difference between successive current inputs.

10. The medium of claim 8 wherein computer readable code for determining a slope of the inductor current comprises computer readable code for receiving a plurality of current inputs over a predetermined period of time; computer readable code for determining an average of the current inputs over the predetermined period of time, and wherein the slope of the inductor current is determined based on the determined average of the current inputs.

11. The medium of claim 8 wherein computer readable code for determining a slope of the inductor current comprises computer readable code for receiving a plurality of current inputs over a predetermined period of time and wherein the current inputs are synchronized to a PWM period.

12. The medium of claim 8 wherein computer readable code for determining a slope of the inductor current comprises computer readable code for receiving a plurality of current inputs over a predetermined period of time and wherein the current inputs are sampled at a synchronized point within non-sequential PWM periods.

13. The medium of claim 8 wherein:
   computer readable code for determining whether the slope exceeds a first predetermined slope comprises computer readable code for determining a first threshold and a first count, computer readable code for determining whether the slope is less than a second predetermined slope comprises computer readable code for determining a second threshold and a second count; and
   computer readable code for determining whether the slope exceeds a first predetermined slope comprises computer readable code for determining a third threshold and a third count.

14. The medium of claim 8 further comprising:
   computer readable code for determining an actuator model associated with the solenoid valve; and
   computer readable code for accessing a chip storing at least one of a first threshold, first count, second threshold, second count, third threshold, and third count associated with the actuator model.

15. A method of determining actuator position for a solenoid valve, the method comprising:
   determining an initial actuator position;
   storing an actuator position based on the initial actuator position;
   determining an actuator model associated with the solenoid valve;
   determining at least one characteristic of the solenoid valve based on the actuator model;
   determining a slope of the inductor current with time;

determining whether the slope exceeds a first predetermined slope for a first predetermined time;

determining whether the slope is less than a second predetermined slope for a second predetermined time when the slope exceeds the first predetermined slope for the first predetermined time;

determining whether the slope exceeds a third predetermined slope for a third predetermined time when the slope exceeds the second predetermined slope for the second predetermined time;

detecting the change in actuator position when the slope exceeds the third predetermined slope for the third predetermined time; and changing the actuator position to an alternate actuator position in response to the detected change in actuator position.

16. A method of determining change in actuator position from inductor current, the method comprising:

determining a slope of the inductor current with time;

determining whether the slope is less than a first predetermined slope for a first predetermined time;

determining whether the slope exceeds a second predetermined slope for a second predetermined time when the slope is less than the first predetermined slope for the first predetermined time;

determining whether the slope is less than a third predetermined slope for a third predetermined time when the slope exceeds the second predetermined slope for the second predetermined time; and determining the change in actuator position when the slope exceeds the third predetermined slope for the third predetermined time.

17. The method of claim 16 wherein determining a slope of the inductor current comprises receiving a plurality of current inputs and determining a difference between successive current inputs.

18. The method of claim 16 wherein determining a slope of the inductor current comprises receiving a plurality of current inputs over a predetermined period of time; determining an average of the current inputs over the predetermined period of time, and wherein the slope of the inductor current is determined based on the determined average of the current inputs.

19. The method of claim 16 wherein determining a slope of the inductor current comprises receiving a plurality of current inputs over a predetermined period of time and wherein the current inputs are synchronized to a PWM period.

20. The method of claim 16 wherein determining a slope of the inductor current comprises receiving a plurality of current inputs over a predetermined period of time and wherein the current inputs are sampled at a synchronized point within non-sequential PWM periods.

* * * * *